US010209292B2

(12) United States Patent
Umemoto et al.

(10) Patent No.: US 10,209,292 B2
(45) Date of Patent: Feb. 19, 2019

(54) PARTIAL DISCHARGE DETERMINATION METHOD, PARTIAL DISCHARGE DETERMINATION APPARATUS, AND PARTIAL DISCHARGE DETERMINATION SYSTEM FOR POWER DEVICE, AND METHOD FOR MANUFACTURING POWER DEVICE INCLUDING THE PARTIAL DISCHARGE DETERMINATION METHOD

(71) Applicant: Mitsubishi Electric Corporation, Chiyoda-ku (JP)

(72) Inventors: Takahiro Umemoto, Chiyoda-ku (JP); Soichiro Kainaga, Chiyoda-ku (JP); Manabu Yoshimura, Chiyoda-ku (JP); Kazuaki Aono, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 10 days.

(21) Appl. No.: 15/520,257

(22) PCT Filed: Dec. 8, 2015

(86) PCT No.: PCT/JP2015/084413
§ 371 (c)(1),
(2) Date: Apr. 19, 2017

(87) PCT Pub. No.: WO2016/098644
PCT Pub. Date: Jun. 23, 2016

(65) Prior Publication Data
US 2017/0363675 A1 Dec. 21, 2017

(30) Foreign Application Priority Data
Dec. 18, 2014 (JP) .................................. 2014-256334

(51) Int. Cl.
*G01R 31/12* (2006.01)
*G01R 31/14* (2006.01)
*G01H 3/08* (2006.01)

(52) U.S. Cl.
CPC .......... *G01R 31/1209* (2013.01); *G01H 3/08* (2013.01); *G01R 31/12* (2013.01)

(58) Field of Classification Search
CPC .... G01R 31/12; G01R 31/44; G01R 31/1209; G01R 31/1218; G01R 31/1272
See application file for complete search history.

(56) References Cited

U.S. PATENT DOCUMENTS 6,725,705 B1   4/2004 Huebler et al.
9,753,080 B2 *  9/2017 Andle ................ G01R 31/1272
(Continued)

FOREIGN PATENT DOCUMENTS

JP    60-69570 A   4/1985
JP     6-27182 A   2/1994
(Continued)

OTHER PUBLICATIONS

International Search Report dated Mar. 8, 2016 in PCT/JP2015/084413 filed Dec. 8, 2015.

*Primary Examiner* — Minh N Tang
(74) *Attorney, Agent, or Firm* — Oblon, McClelland, Maier & Neustadt, L.L.P.

(57) ABSTRACT

A partial discharge determination method and apparatus, and a partial discharge determination system capable of indicating how much margin is left before dielectric breakdown, in a lighting impulse withstand voltage test, and a power device for which whether partial discharge is caused is determined by them, and a method for manufacturing a power device including the partial discharge determination method. A low-pass filter receives an acoustic signal resulting from application of an impulse voltage and acquired by an acous-
(Continued)

tic emission sensor, and removes an electromagnetic noise superimposed on the acoustic signal. A mechanical oscillation removal unit removes a mechanical oscillation component of a device under test, from the acoustic signal resulting from application of the impulse voltage which is a high voltage, based on the mechanical oscillation component acquired in advance and included in the acoustic signal resulting from application of the impulse voltage which is a low voltage.

9 Claims, 10 Drawing Sheets

(56) References Cited

U.S. PATENT DOCUMENTS

| 2005/0194979 | A1* | 9/2005 | Roman | G01R 31/1272 |
| | | | | 324/536 |
| 2008/0309351 | A1* | 12/2008 | Stewart | G01R 31/1272 |
| | | | | 324/551 |

FOREIGN PATENT DOCUMENTS

| JP | 8-320356 A | 12/1996 |
| JP | 9-152424 A | 6/1997 |
| JP | 2000-137053 A | 5/2000 |
| JP | 2004-61358 A | 2/2004 |
| JP | 2005-128699 A | 5/2005 |
| JP | 2008-26070 A | 2/2008 |
| JP | 2008-51566 A | 3/2008 |
| JP | 2008-180681 A | 8/2008 |

* cited by examiner

PARTIAL DISCHARGE DETERMINATION METHOD, PARTIAL DISCHARGE DETERMINATION APPARATUS, AND PARTIAL DISCHARGE DETERMINATION SYSTEM FOR POWER DEVICE, AND METHOD FOR MANUFACTURING POWER DEVICE INCLUDING THE PARTIAL DISCHARGE DETERMINATION METHOD

TECHNICAL FIELD

The present invention relates to a partial discharge determination method, a partial discharge determination apparatus, and a partial discharge determination system for a power device, as well as a power device for which whether partial discharge is caused is determined by the method, apparatus, and system, and a method for manufacturing a power device including the partial discharge determination method.

BACKGROUND ART

A typical example of internal abnormalities during normal operation of an electrical device such as power generating device or transforming device is partial discharge which occurs in the device. Partial discharge is a precursory phenomenon of dielectric breakdown (complete electrical breakdown) of the device. Dielectric breakdown of the device can be prevented by establishing a technique for reliably detecting partial discharge. Generally, a high-voltage-charged unit of the electrical device is not exposed but housed in a casing of an insulating material or a metal case (tank) at a ground potential. Because of the fact that the high-voltage-charged unit from which partial discharge may occur is thus enclosed in another structure, the fact that a partial discharge signal generated in the device is extremely weak, and the fact that various external noises are superimposed on the partial discharge signal during operation of the electrical device in a field, it is necessary to build a scheme for distinguishing the partial discharge signal from noise signals and thereby extracting the partial discharge signal.

As a method for detecting partial discharge of an electrical device, a method using an acoustic emission (AE) sensor is known. For example, Japanese Patent Laying-Open No. 2008-180681 (PTD 1) discloses a technique for simultaneously detecting, by the acoustic emission sensor, an elastic wave signal generated due to partial discharge and detecting, by a current sensor, a current flowing along the tank's wall surface or a grounding conductor due to partial discharge. This technique makes use of a difference in space propagation velocity between an acoustic signal and an electrical signal. Namely, when a partial discharge signal is generated in an electrical device, a current pulse due to the partial discharge is initially detected by the current sensor. Then, after a predetermined time difference which is determined by the distance between the high-voltage-charged unit and the acoustic emission sensor, the partial discharge signal is detected by the acoustic emission sensor. When the number of times i) the signal detected by the current sensor is synchronized with the cycle of the waveform of a voltage applied to the electrical device and ii) the time difference between respective signals detected by the current sensor and the acoustic emission sensor becomes zero, is a predetermined number within a certain time, it is determined that partial discharge has occurred. In this way, the partial discharge signal can be distinguished from external noise.

Moreover, one method for estimating the partial-discharge charge amount, namely the amount of electric charge released due to partial discharge which occurs in a power device in operation is a method using the maximum amplitude of a partial discharge signal waveform detected by the acoustic emission sensor. For example, Japanese Patent Laying-Open No. 9-152424 (PTD 2) discloses that a correlation between the maximum amplitude detected by the acoustic emission sensor and the partial-discharge charge amount is determined in advance, and this correlation is used to determine the magnitude of the discharge which occurs in the power device.

CITATION LIST

Patent Document

PTD 1: Japanese Patent Laying-Open No. 2008-180681
PTD 2: Japanese Patent Laying-Open No. 9-152424

SUMMARY OF INVENTION

Technical Problem

The techniques disclosed in PTD 1 and PTD 2 are directed to a preventive maintenance diagnosis technique for preventing dielectric breakdown due to degradation with time of an electrical device after installed in a field, and basically applied to normal operation of the electrical device to which commercial AC power is applied.

For electrical devices such as power transforming device and power distribution board, a lighting impulse withstand voltage test is conducted as an insulation test before product shipment or a test for product development. In terms of a standard specification (standard specification JEC0103 (2005) defined by the Japanese Electrotechnical Committee, for example), an electrical device is regarded as passing the test, if dielectric breakdown does not occur in the device when an impulse waveform having a prescribed voltage waveform is applied. However, in order to ensure the insulation reliability of a product or to clarify a margin which is left before dielectric breakdown, it is important that partial discharge which is a precursory phenomenon of dielectric breakdown can be detected. Namely, there have been needs to detect partial discharge in a lighting impulse withstand voltage test and further to clarify how much margin is left before dielectric breakdown.

Such needs cannot be met by directly applying the scheme which uses the acoustic emission sensor as disclosed in PTD 1 and PTD 2. The reasons are as follows.

When the partial discharge detection method of PTD 1 and PTD 2 is used, it is impossible to detect a partial-discharge current pulse signal transmitted along the tank's wall surface or a grounding conductor, because i) at the moment when a voltage is generated by a lighting impulse voltage generator which is used for a high-voltage electrical device, very large electromagnetic noise is generated due to the operating principle of the lighting impulse voltage generator, and ii) when a lighting impulse voltage is applied, a charging current which flows through a capacitance of the device under test is superimposed on a partial discharge current.

Moreover, when an impulse voltage having a short rise time is applied to the device under test, a charging current momentarily flows. Due to this, the device under test itself mechanically oscillates. This mechanical oscillation is converted to an elastic wave to be propagated in the tank, and the elastic wave is detected by an acoustic emission sensor. Therefore, regardless of whether or not partial discharge occurs in the tank, the acoustic signal is detected after a certain time from the application of the voltage. PTD 1 does not take into consideration at all the influence of the mechanical oscillation component.

As seen from the above, the scheme of PTD 1 cannot detect partial discharge in a lighting impulse withstand voltage test. Likewise, the scheme of PTD 2 cannot acquire, by the acoustic emission sensor, the partial discharge signal in the lighting impulse withstand voltage test and therefore cannot estimate the partial-discharge charge amount.

The present invention has been made to solve the problems as described above, and an object of the invention is to provide a partial discharge determination method, a partial discharge determination apparatus, and a partial discharge determination system for determining whether or not partial discharge is caused, by which partial discharge can be detected and further how much margin is left before dielectric breakdown can be indicated in a lighting impulse withstand voltage test, and to provide a power device for which whether or not partial discharge is caused is determined, and a method for manufacturing a power device including the partial discharge determination method.

Solution to Problem

The present invention is directed to a partial discharge determination method using an acoustic emission sensor. The method includes: applying an impulse voltage to a device under test; acquiring an acoustic signal resulting from application of the impulse voltage, by the acoustic emission sensor installed on a wall surface of a casing which houses the device under test; removing, through a low-pass filter, an electromagnetic noise superimposed on the acoustic signal detected by the acoustic emission sensor; removing a mechanical oscillation component of the device under test, from the acoustic signal resulting from application of the impulse voltage which is a high voltage, based on the mechanical oscillation component acquired in advance and included in the acoustic signal resulting from application of the impulse voltage which is a low voltage causing no partial discharge; determining whether partial discharge is caused in the device under test, based on the acoustic signal resulting from application of the high voltage, the mechanical oscillation component being removed from the acoustic signal; and determining, when the partial discharge is caused, a margin before dielectric breakdown of the device under test, by determining a feature amount of partial discharge based on a correlation, acquired in advance, between a feature amount of a partial discharge signal obtained as an acoustic signal and the feature amount of partial discharge.

Advantageous Effects of Invention

In accordance with the present invention, in a lighting impulse withstand voltage test, the electromagnetic noise superimposed on the acoustic signal and the mechanical oscillation component of the device under test are removed to thereby enable accurate determination as to whether or not partial discharge is caused in the device under test. Further, based on the measurement signal taken by the acoustic emission sensor and the feature amount of the partial discharge signal which are acquired in advance, how much margin is left before dielectric breakdown of the device under test can be recognized.

DESCRIPTION OF EMBODIMENTS

Figure 1:
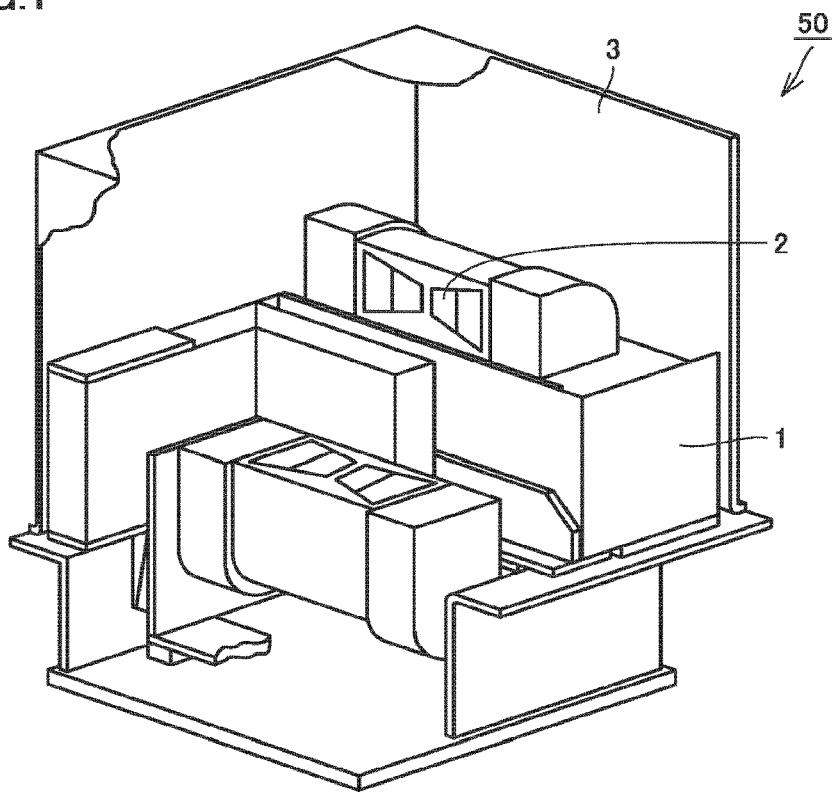
FIG. 1 is a perspective view showing a configuration of a shell-type power transformer as an example of the device to be tested for partial discharge in accordance with a first embodiment of the present invention.

In the following, a partial discharge determination method and a partial discharge determination apparatus in accordance with an embodiment of the present invention will be described with reference to the drawings. In the following description of the embodiment, the same or corresponding parts are denoted by the same reference characters, and a description thereof will not be repeated.

In the following description, a shell-type power transformer is used as an example of the electrical device which is a device to be tested. However, a device to be tested by the partial discharge determination method and the partial discharge determination apparatus in accordance with the present invention may be any electrical device such as power transforming device or power distribution board. For example, the device to be tested may be core-type transformer, insulating switching device, or the like.

First Embodiment

Lighting Impulse Withstand Voltage Test

On electrical devices such as power transforming device and power distribution board, a lighting impulse withstand voltage test is conducted as one of insulation tests which are performed before product shipment. This test is conducted for ensuring electrical insulation performance even when an abnormal voltage waveform is applied during normal operation of an electrical device such as power transformer. The abnormal voltage waveform is for example lighting surge or switching surge which is generated outside the electrical device. Specifically, the test is conducted for ensuring that dielectric breakdown will not occur even when a voltage waveform defined by the standard specification is applied to an electrical device. It should be noted that, in order to ensure the insulation reliability of a product, it is necessary to clarify a margin before dielectric breakdown due to an applied voltage.

Impulse Voltage Generator

Next, a description will be given of an operating principle of an impulse voltage generator used for the impulse withstand voltage test for a power device such as power transformer. Initially several capacitors connected in parallel are charged with a predetermined voltage, and thereafter discharge is simultaneously caused in a plurality of sphere gaps to thereby spuriously connect the capacitors in series as a simulation. Thus, a waveform is output which has a wave front duration and a wave tail duration determined by circuit constants of a circuit including the impulse voltage generator and a device to be tested.

Due to this operating principle, very strong electromagnetic noise resultant from the sphere gap discharge is emitted simultaneously with the output of the impulse voltage waveform. It is therefore considerably difficult to detect partial discharge occurring in the power transformer.

For example, in the case of a method which is used generally as means for detecting partial discharge of a high-voltage electrical device during normal operation in which a commercial AC voltage is applied, such as an electromagnetic wave method for detecting, by means of an electromagnetic sensor (antenna), an electromagnetic wave which is generated due to partial discharge or a method for detecting a current pulse which flows due to occurrence of partial discharge, a partial discharge signal in the impulse withstand voltage test is buried in the electromagnetic noise of the impulse voltage generator, which makes it impossible to detect occurrence of the partial discharge.

As another method for detecting partial discharge of a power device, a method is also generally performed which detects, by an acoustic emission sensor, an elastic wave signal generated due to partial discharge and propagated in the device. The applicant has made it clear that use of this method for the lighting impulse withstand voltage test is accompanied by the following problems.

In an impulse withstand voltage test for a power transformer, application of an impulse voltage to the transformer causes a charging current to momentarily flow through a capacitance of the transformer. As the charging current flows through coils, a physical force is generated between windings and the coil mechanically oscillates. The mechanical oscillation of the coil causes an elastic wave to be propagated to an insulating oil contained in a transformer tank. Therefore, when it is attempted to detect partial discharge by means of an acoustic emission sensor, the mechanical oscillation component is detected regardless of whether or not partial discharge occurs in the tank.

Margin Before Dielectric Breakdown

In the present embodiment, a margin is used as an indicator of a tolerance before dielectric breakdown in an impulse withstand voltage test.

Device to be Tested

FIG. 1 is a perspective view showing a configuration of a shell-type power transformer 50 as an example of the device to be tested for partial discharge in accordance with the first embodiment of the present invention. In FIG. 1, the components are each partially cut away.

As shown in FIG. 1, shell-type power transformer 50 includes a core 1, a coil portion 2 formed of windings around core 1, a tank 3 housing core 1 and coil portion 2, and an insulating oil (not shown) which is contained in tank 3 and in which core 1 and coil portion 2 are immersed.

Core 1 is made up of multiple laminated magnetic steel sheets. In the present embodiment, two rectangular parallelepiped cores 1 each having an opening in the central portion are arranged next to each other.

Coil portion 2 is wound around respective legs, adjacent to each other, of two cores 1, and runs through each of respective openings of these cores 1.

The insulating oil serves as both an electrically insulating medium and a cooling medium. In tank 3, the insulating oil flows around cores 1 and coil portion 2. In the present embodiment, mineral oil is used as the insulating oil. Alternatively, ester oil may be used as the insulting oil.

Figure 2:
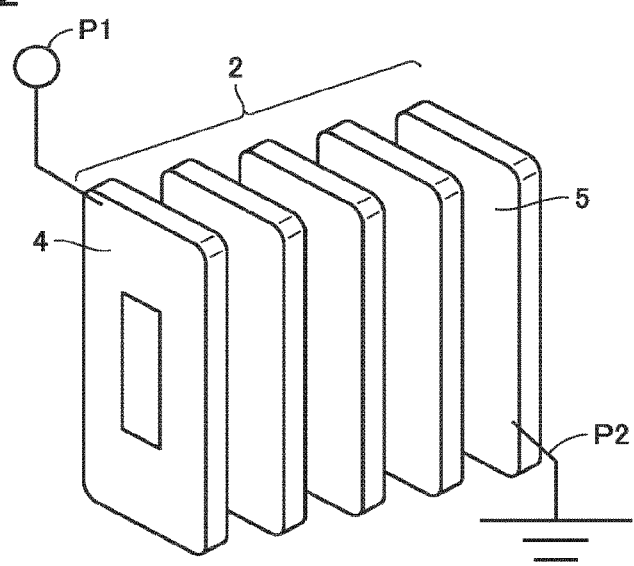
FIG. 2 is a perspective cross-sectional view showing a coil structure of a shell-type power transformer as a typical example of the device to be tested in accordance with the first embodiment of the present invention.

FIG. 2 is a perspective cross-sectional view showing a coil structure of shell-type power transformer 50 as a typical example of the device to be tested in accordance with the first embodiment of the present invention.

In the shell-type power transformer, coil portion 2 is made up of a plurality of coils arranged side by side, from a high-voltage-side coil 4 at the highest voltage which is connected to an impulse voltage generator and to which a high-voltage impulse waveform is applied, to a ground coil 5 at the lowest voltage.

The lowest-voltage ground coil 5 has an end P2 which is grounded. As the impulse voltage is applied to a terminal P1 of high-voltage-side coil 4, a highest electric field is formed around high-voltage-side coil 4 to which the voltage is applied, and the region around coil 4 becomes a site of occurrence of partial discharge. Generally, shell-type power transformer 50 is designed to suppress development of partial discharge even when the partial discharge is caused and developed, by appropriately disposing an insulating barrier.

Partial Discharge Determination Method

The partial discharge determination method in accordance with the present embodiment determines, by means of an acoustic emission sensor, whether or not partial discharge occurs when an impulse voltage is applied. At this time, the method avoids a partial discharge signal from being buried in the aforementioned electromagnetic noise. Further, the method makes use of a mechanical oscillation component waveform which is generated upon application of a low voltage which does not certainly cause partial discharge, so as to remove a mechanical oscillation component when a high voltage is applied which may cause partial discharge. In this way, the method extracts only a partial discharge signal. Further, the partial discharge determination method for an electrical device in accordance with the present embodiment determines a margin before dielectric breakdown of the electrical device, from a feature amount of a partial discharge signal of the acoustic emission sensor and a feature amount of partial discharge which are acquired in advance.

Partial Discharge Determination Apparatus

Figure 3:
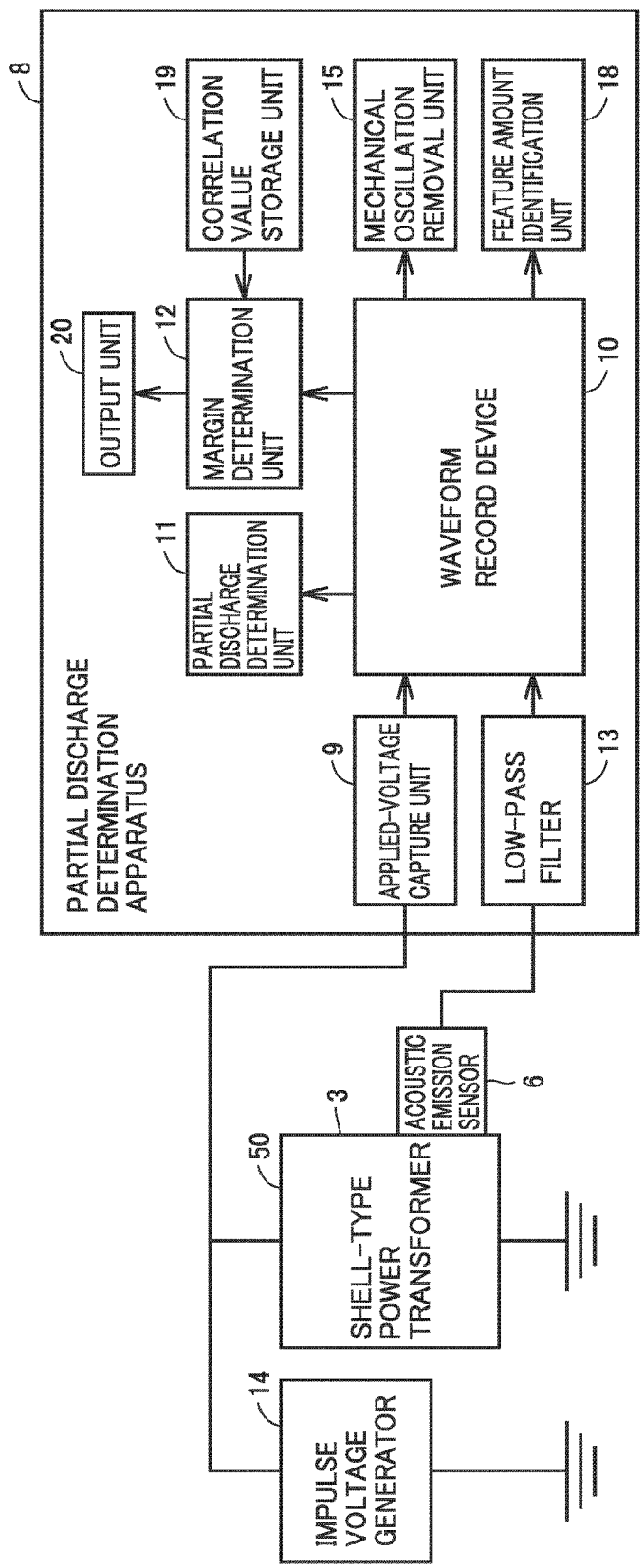
FIG. 3 is a diagram showing a configuration of a partial discharge determination apparatus in accordance with the first embodiment.

FIG. 3 is a diagram showing a configuration of a partial discharge determination apparatus in accordance with the first embodiment.

Referring to FIG. 3, a partial discharge determination apparatus 8 includes a low-pass filter 13, an applied-voltage capture unit 9, a waveform record device 10, a mechanical oscillation removal unit 15, a partial discharge determination unit 11, a feature amount identification unit 18, a margin determination unit 12, a correlation value storage unit 19, and an output unit 20.

Impulse voltage generator 14 applies, to shell-type power transformer 50, an impulse voltage waveform which meets the specification. For a general impulse withstand voltage test for a high-voltage device, the wave front duration (rise time) and the wave tail duration (fall time) of the voltage waveform are defined by the specification and the peak value of the voltage waveform is defined by the specification depending on the rated voltage and/or the capacitance of the high-voltage device.

Applied-voltage capture unit 9 captures the impulse voltage waveform to store it in waveform record device 10, and identifies the voltage application start time from the captured impulse voltage waveform to store it in waveform record device 10. Since the voltage waveform which is output from impulse voltage generator 14 is of a high voltage, applied-voltage capture unit 9 may store, in waveform record device 10, the voltage waveform obtained through voltage division of the captured impulse voltage waveform by a voltage divider.

Acoustic emission sensor 6 is installed on the external surface of tank 3 of shell-type power transformer 50 which is a device to be tested. Acoustic emission sensor 6 acquires an acoustic signal resulting from application of the impulse voltage and generated in tank 3. Acoustic emission sensor 6 detects, in accordance with the AE (Acoustic Emission) method, an elastic wave (stress wave) which is caused by a mechanical motion of a substance, and outputs the result of the detection in the form of an electrical signal.

As described above, impulse voltage generator 14 generates spark discharge in a sphere gap provided in generator 14 to thereby output the voltage waveform. Very large electromagnetic noise due to the spark discharge in the sphere gap is a factor which makes it difficult to detect the partial discharge signal. However, the duration in which the electromagnetic noise is mainly generated is at most on the order of several tens of microseconds. As for the acoustic signal, the propagation velocity of the acoustic signal in the insulating oil is generally 1400 meters per second. It takes about several hundreds of microseconds to several milliseconds for the acoustic signal generated from the device under test housed in tank 3 to reach acoustic emission sensor 6, which, however, depends on the size of tank 3. Namely, the time range in which the acoustic signal resulting from the application of the impulse voltage is detected by acoustic emission sensor 6 is after decay of most of the electromagnetic noise generated from impulse voltage generator 14. This is a significant advantage of the use of acoustic emission sensor 6 as means for detecting partial discharge. However, even after most of the electromagnetic noise decays, the measurement signal of acoustic emission sensor 6 still has its waveform on which the electromagnetic noise component is superimposed. In order to address this, low-pass filter 13 is used.

Low-pass filter 13 removes the electromagnetic noise component (the noise component due to impulse voltage generator 14) from the acquired measurement signal of acoustic emission sensor 6. It should be noted that the function of low-pass filter 13 may be implemented by digital signal processing. As low-pass filter 13, a low-pass filter having a cutoff frequency characteristic that enables the inherent acoustic signal to be separated from the electromagnetic noise in terms of frequency is selected. In the electromagnetic noise which is emitted due to spark discharge in the sphere gap in impulse voltage generator 14, the component on the order of several hundreds of MHz is strong. In contrast, the acoustic signal is several tens of kHz to several hundreds of kHz. For example, low-pass filter 13 having a cutoff frequency of about 1 MHz can be used to remove the electromagnetic noise component superimposed on the measurement signal of acoustic emission sensor 6, and pass only the acoustic signal component to be detected.

Since the electromagnetic noise is removed by low-pass filter 13, the main component of the acoustic signal generated due to the application of the impulse voltage can be acquired. However, the signal having passed low-pass filter 13 contains a noise component due to mechanical oscillation of coil portion 2 in shell-type power transformer 50 that is caused by momentary flow of charging current, regardless of whether or not partial discharge occurs in shell-type power transformer 50. This is addressed by mechanical oscillation removal unit 15.

Mechanical oscillation removal unit 15 removes the noise component which is generated due to mechanical oscillation and contained in the signal processed by low-pass filter 13. Generally, when the impulse withstand voltage test is performed on a high-capacity power device such as shell-type power transformer 50, a test voltage defined by the specification is not immediately applied. Rather, a low voltage waveform which will not certainly cause partial discharge in tank 3 of shell-type power transformer 50 is output several times to confirm whether or not the wave having the wave front duration and the wave tail duration which meet the specification is output. It should be noted that, even when the low voltage waveform is applied, charging current flows through coil portion 2 and therefore a mechanical oscillation component of coil portion 2 is detected by acoustic emission sensor 6. The mechanical oscillation component has a characteristic that the period of the mechanical oscillation component remains totally the same even when the peak value of the impulse voltage applied to the device under test is varied, but only the amplitude of the mechanical oscillation component is varied.

Figure 4:
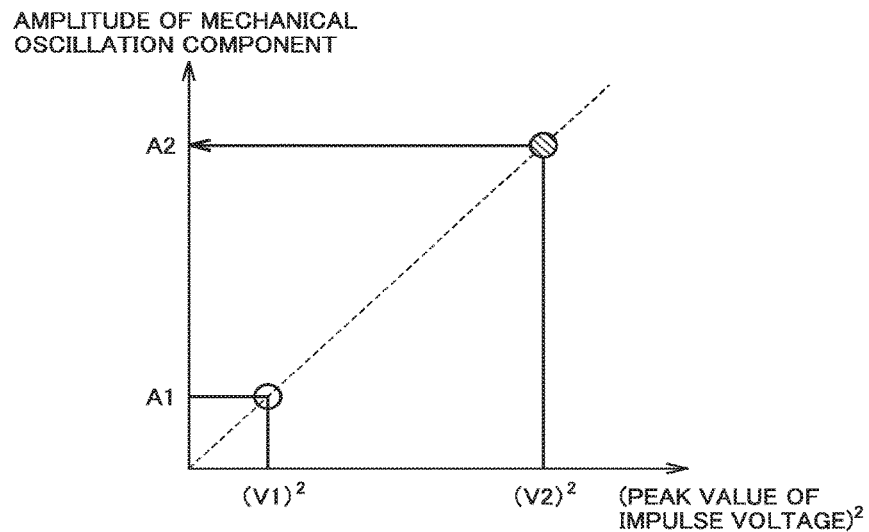
FIG. 4 is a diagram showing a relation between the square of the peak value of an impulse voltage and the amplitude value of a mechanical oscillation component.

FIG. 4 is a diagram showing a relation between the square of the peak value of an impulse voltage and the amplitude value of a mechanical oscillation component.

The inventors of the present application have experimentally revealed, as shown in FIG. 4, that the amplitude value of the mechanical oscillation component is proportional to the square of the charging current flowing through coil portion 2 of each winding, namely proportional to the square of the peak value of the impulse voltage.

The following expressions hold: where V1 is the peak value of the impulse voltage when the low-voltage waveform which will not cause partial discharge is applied, A1 is the amplitude value of the mechanical oscillation component, V2 is the peak value of the impulse voltage when the high voltage is applied in accordance with the specification of the withstand voltage test, A2 is the amplitude value of the mechanical oscillation component, and K is the factor of proportionality.

$$K = (V2/V1)^2 \quad (1)$$

$$A2 = A1 \times K \quad (2)$$

Waveform record device 10 records acoustic signal waveform LW which is output from low-pass filter 13 when the low voltage which will not cause partial discharge is applied, and acoustic signal waveform HW which is output from low-pass filter 13 when the high voltage is applied in accordance with the specification of the withstand voltage test.

When the low voltage is applied, partial discharge does not occur. Therefore, acoustic signal waveform LW is the waveform of the mechanical oscillation component included in the signal detected by acoustic emission sensor 6. Acoustic signal waveform LW thus has amplitude value A1 of the mechanical oscillation component.

Mechanical oscillation removal unit 15 identifies amplitude value A1 of the mechanical oscillation component, from acoustic signal waveform LW which is generated when the low voltage is applied and stored in waveform record device 10. The mechanical oscillation removal unit calculates factor of proportionality K in accordance with the expression (1).

Mechanical oscillation removal unit 15 multiplies by K the acoustic signal waveform LW which is generated when the low voltage is applied, to thereby determine mechanical oscillation component waveform NW which is generated when the high voltage is applied.

Mechanical oscillation removal unit 15 subtracts mechanical oscillation component waveform NW which is generated when the high voltage is applied, from acoustic signal waveform HW which is generated when the high voltage is applied and stored in waveform record device 10. In this way, the acoustic signal waveform from which the mechanical oscillation component, which is generated when the high voltage is applied, has been removed is obtained.

By low-pass filter 13 and mechanical oscillation removal unit 15, the electromagnetic noise due to impulse voltage generator 14 and the mechanical oscillation component of coil portion 2 can be removed from the acoustic signal waveform detected by acoustic emission sensor 6. Meanwhile, external noise other than the aforementioned partial discharge signal may be superimposed on the acoustic signal component measured by means of acoustic emission sensor 6. For example, an impact sound generated upon impact of a foreign matter against tank 3 during the impulse voltage test or an elastic wave due to a sound generated outside tank 3, for example, is detected as external noise by acoustic emission sensor 6 which is installed on the wall surface of tank 3. It is partial discharge determination unit 11 that serves as means for removing the external noise to detect partial discharge.

The propagation velocity of an acoustic signal in an insulating oil is generally 1400 meters per second. Based on this acoustic signal propagation velocity V and the distance, which is known in advance, between acoustic emission sensor 6 and the high-voltage-charged unit (namely high-voltage-side coil 4) in a structure of shell-type power transformer 50, the time difference between the time when application of the impulse voltage is started and the time when the partial discharge signal reaches acoustic emission sensor 6 can be predicted to fall within a certain range.

More specifically, partial discharge determination unit 11 calculates time t1 by dividing, by acoustic signal propagation velocity V in the oil, the shortest distance between the location where acoustic emission sensor 6 is installed and the location where the high-voltage-charged unit in the structure of shell-type power transformer 50 is installed.

Partial discharge determination unit 11 calculates time t2 by dividing, by acoustic signal propagation velocity V in the oil, the longest distance between the location where acoustic emission sensor 6 is installed and the location where the high-voltage-charged unit which is in the structure of shell-type power transformer 50 is located.

Partial discharge determination unit 11 determines that partial discharge is caused in shell-type power transformer 50, when the acoustic signal component is detected within the range of time from t1 to t2 with respect to the time when application of the impulse voltage is started. Partial discharge determination unit 11 determines that partial discharge is not caused in shell-type power transformer 50 when the acoustic signal component is not detected within the range of time from t1 to t2 with respect to the time when application of the impulse voltage is started.

As means for acquiring the time when application of the impulse voltage is started, an electromagnetic wave sensor signal or a current sensor signal may be used.

Margin determination unit 12 determines the margin before dielectric breakdown of shell-type power transformer 50, using a correlation, which is acquired in advance before the impulse withstand voltage test, between the partial discharge signal waveform obtained by the acoustic emission sensor and a feature amount of the partial discharge.

Output unit 20 indicates the determined margin before the dielectric breakdown.

Partial Discharge Determination System

Figure 5:
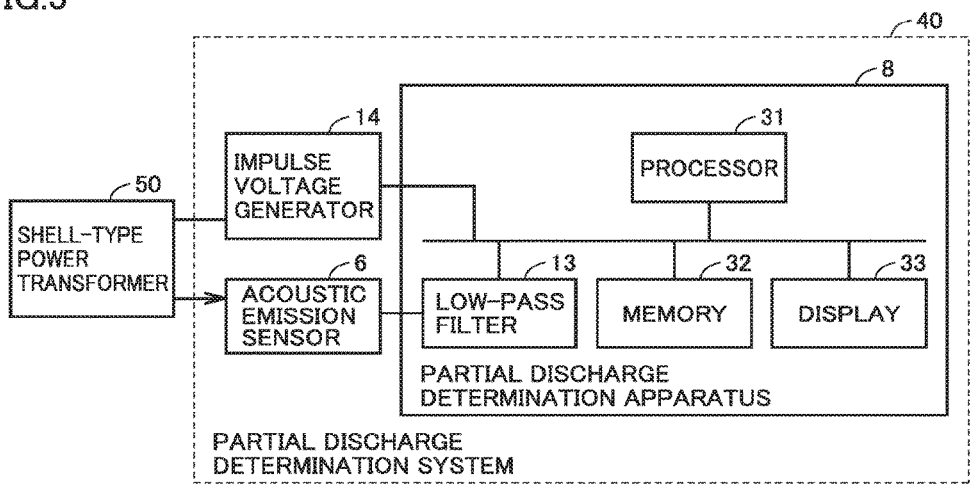
FIG. 5 is a diagram showing a configuration of a partial discharge determination system in accordance with the first embodiment of the present invention.

FIG. 5 is a diagram showing a configuration of a partial discharge determination system 40 in accordance with the first embodiment of the present invention.

Partial discharge determination system 40 includes aforementioned impulse voltage generator 14, acoustic emission sensor 6, and partial discharge determination apparatus 8. In FIG. 5, partial discharge determination apparatus 8 is expressed as a hardware configuration. Applied-voltage capture unit 9, partial discharge determination unit 11, margin determination unit 12, mechanical oscillation removal unit 15, and feature amount identification unit 18 in FIG. 3 are implemented by a processor 31 which executes a program stored in a memory 32. Output unit 20 in FIG. 3 is configured as a display 33. Correlation value storage unit 19 and waveform record device 10 in FIG. 3 are configured as memory 32.

Partial Discharge Determination Method

Figure 6:
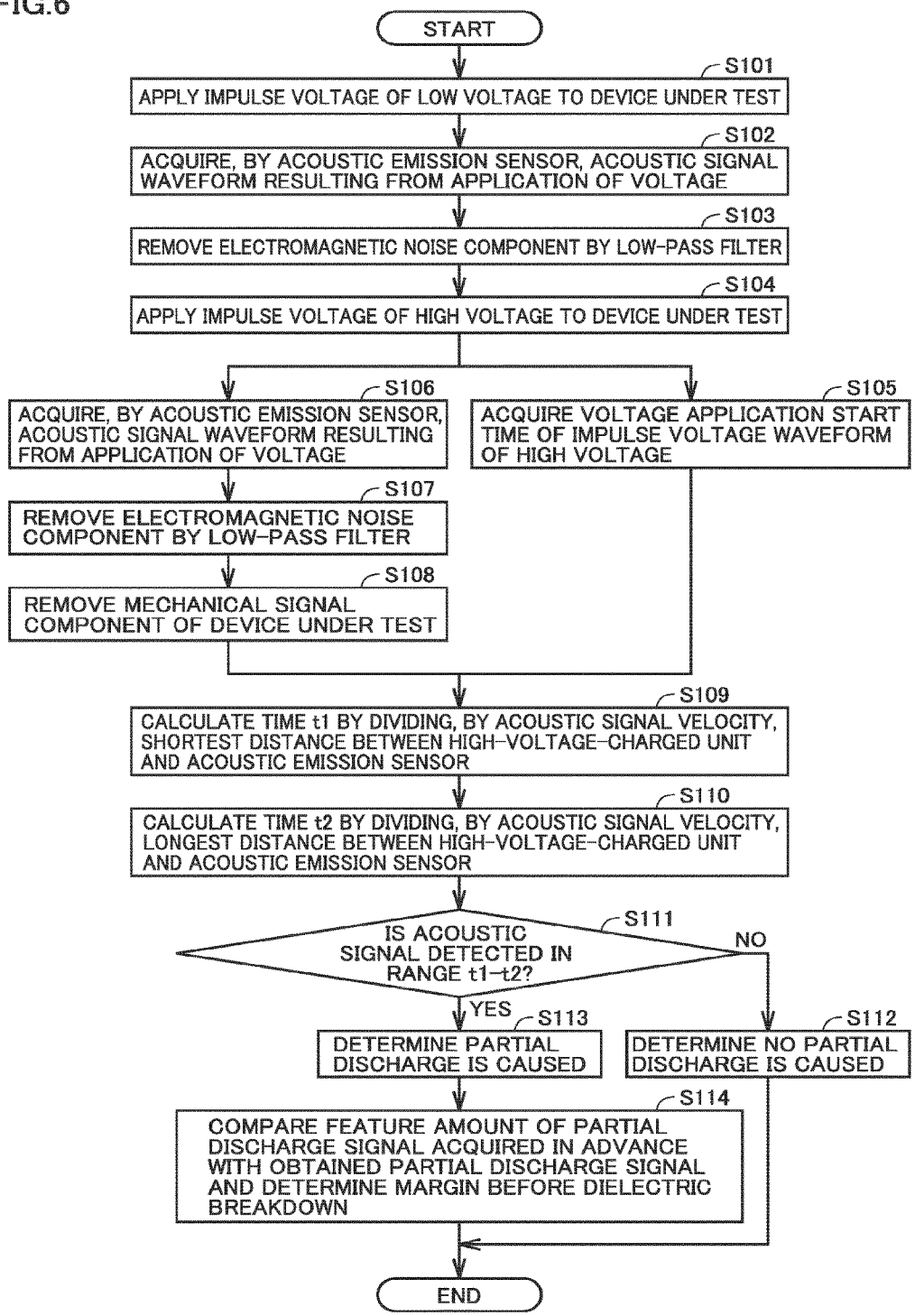
FIG. 6 is a flowchart showing a procedure of a partial discharge determination method in accordance with the first embodiment of the present invention.
Figure 7:
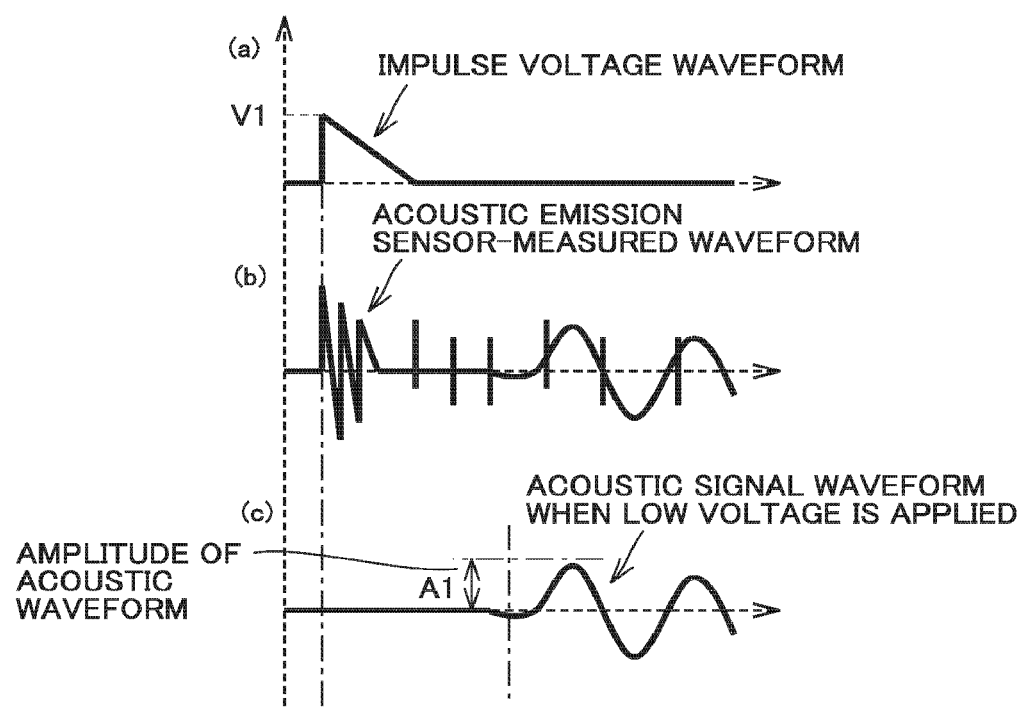
FIG. 7 is a diagram for illustrating waveforms obtained by the partial discharge determination method.
Figure 8:
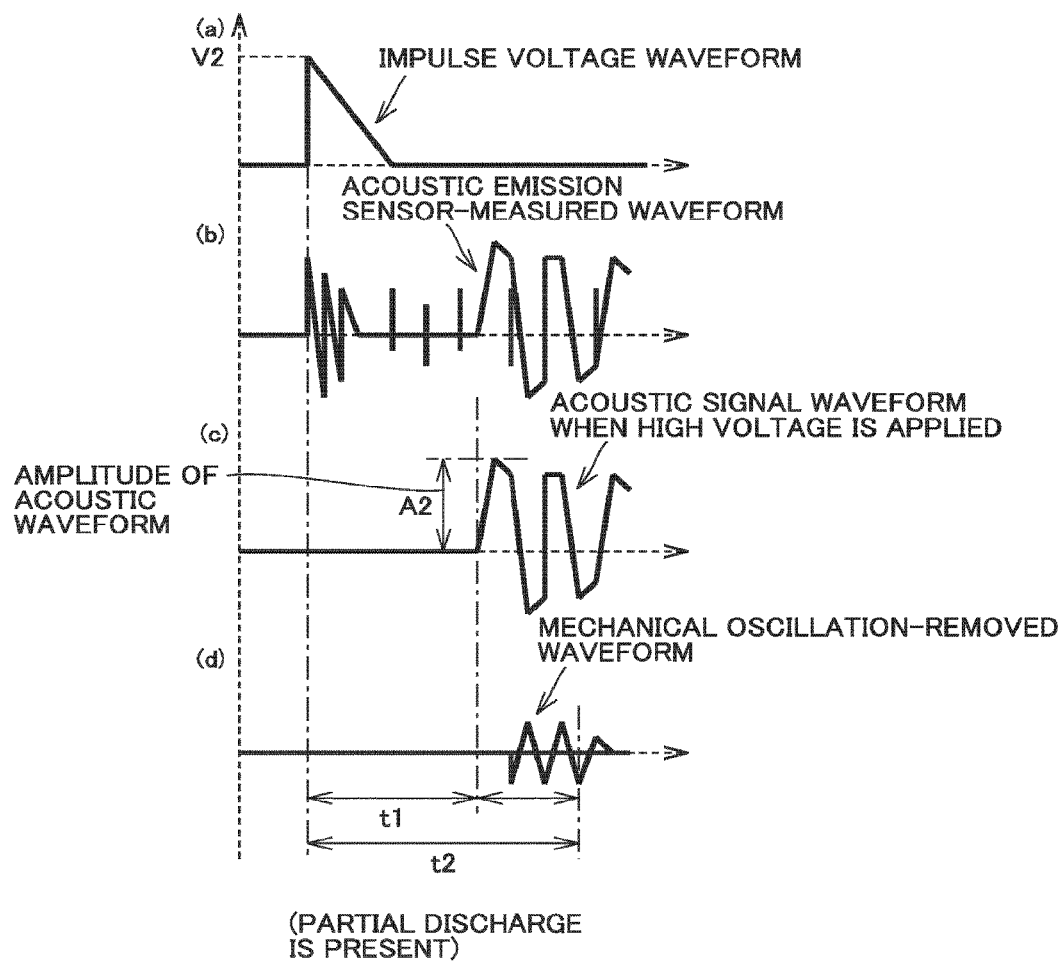
FIG. 8 is a diagram for illustrating waveforms obtained by the partial discharge determination method.

FIG. 6 is a flowchart showing a procedure of a partial discharge determination method in accordance with the first embodiment of the present invention. FIGS. 7 and 8 show examples of waveforms which can be acquired in accordance with the flowchart of FIG. 6. The partial discharge determination method in accordance with the present embodiment will be described below in order of the steps.

First, in step S101, impulse voltage generator 14 applies to shell-type power transformer 50 an impulse voltage waveform of a low voltage meeting the specification. FIG. 7 (*a*) shows an example of the impulse voltage waveform of the low voltage. V1 is the peak value of the impulse voltage waveform of the low voltage.

In step S102, an acoustic signal resulting from application of the impulse voltage is acquired by acoustic emission sensor 6 installed on the wall surface of tank 3. FIG. 7 (*b*) shows an example of the waveform of the acoustic signal acquired by acoustic emission sensor 6 (acoustic emission sensor-measured waveform).

In step S103, the acquired measurement signal of acoustic emission sensor 6 is passed through low-pass filter 13, and accordingly an electromagnetic noise component (noise component due to impulse voltage generator 14) is removed from the measurement signal of acoustic emission sensor 6. Acoustic signal waveform LW which is generated when the low voltage is applied and which is output from low-pass filter 13 is stored in waveform record device 10. FIG. 7 (*c*) shows an example of acoustic signal waveform LW which is generated when the low voltage is applied and which is output from low-pass filter 13. A1 is the amplitude of acoustic signal waveform LW.

In step S104, impulse voltage generator 14 applies, to shell-type power transformer 50, an impulse voltage waveform of a high voltage meeting the specification. FIG. 8 (*a*)

shows an example of the impulse voltage waveform of the high voltage. V2 is the peak value of the impulse voltage waveform of the low voltage.

In step S105, applied-voltage capture unit 9 captures the impulse voltage waveform of the high voltage to store the captured waveform in waveform record device 10, and identifies the time when application of the voltage is started, from the captured impulse voltage waveform, to store the identified time in waveform record device 10.

In parallel with step S105, acoustic emission sensor 6 installed on the wall surface of tank 3 acquires an acoustic signal resulting from the application of the impulse voltage in step S106. FIG. 8 (b) shows an example of the waveform of the acoustic signal acquired by acoustic emission sensor 6 (acoustic emission sensor-measured waveform).

In step S107, the acquired measurement signal of acoustic emission sensor 6 is passed through low-pass filter 13, and accordingly an electromagnetic noise component (noise component due to impulse voltage generator 14) is removed from the measurement signal of acoustic emission sensor 6. Acoustic signal waveform HW which is generated when the high voltage is applied and which is output from low-pass filter 13 is stored in waveform record device 10. FIG. 8 (c) shows an example of acoustic signal waveform HW which is generated when the high voltage is applied and which is output from low-pass filter 13. A2 is the amplitude of acoustic signal waveform HW.

In step S108, mechanical oscillation removal unit 15 removes a noise component which is generated due to mechanical oscillation and contained in the signal processed by low-pass filter 13. Specifically, from acoustic signal waveform LW which is generated when the low voltage is applied and which is stored in waveform record device 10, mechanical oscillation removal unit 15 identifies amplitude value A1 of the mechanical oscillation component. The mechanical oscillation removal unit calculates factor or proportionality K in accordance with the expression (1). Mechanical oscillation removal unit 15 multiplies by K the acoustic signal waveform LW which is generated when the low voltage is applied, to thereby determine mechanical oscillation component waveform NW which is generated when the high voltage is applied. Mechanical oscillation removal unit 15 subtracts, from acoustic signal waveform HW which is generated when the high voltage is applied and which is stored in waveform record device 10, mechanical oscillation component waveform NW which is generated when the high voltage is applied, to thereby obtain an acoustic signal waveform, from which the mechanical oscillation component generated when the high voltage is applied has been removed. FIG. 8 (d) is a chart showing an example of the acoustic signal waveform from which the mechanical oscillation component, which is generated when the high voltage is applied, has been removed.

In step S109, partial discharge determination unit 11 calculates time t1 by dividing, by acoustic signal propagation velocity V in the oil, the shortest distance between the location of acoustic emission sensor 6 and the location of the high-voltage-charged unit in the structure of shell-type power transformer 50.

In step S110, partial discharge determination unit 11 calculates time t2 by dividing, by acoustic signal propagation velocity V in the oil, the longest distance between the location of acoustic emission sensor 6 and the location of the high-voltage-charged unit in the structure of shell-type power transformer 50.

In step S111, partial discharge determination unit 11 determines whether or not an acoustic signal component is detected within the range of time from t1 to t2 (t1 or more and t2 or less) of the acoustic signal waveform obtained in step S108, with respect to the time when application of the impulse voltage is started. When the acoustic signal component is detected within the range of time from t1 to t2, the process proceeds to step S113. When the acoustic signal component is not detected within the range of time from t1 to t2, the process proceeds to step S112. In step S112, partial discharge determination unit 11 determines that partial discharge is not caused.

In step S113, partial discharge determination unit 11 determines that partial discharge is caused.

In step S114, feature amount identification unit 18 identifies a feature amount of the partial discharge signal extracted by partial discharge determination unit 11 when shell-type power transformer 50, which is a device to be actually tested, is connected. From the feature amount of the partial discharge signal that is identified by feature amount identification unit 18, margin determination unit 12 determines a margin before dielectric breakdown of shell-type power transformer 50, using a correlation value which is obtained and stored in correlation value storage unit 19 before the impulse withstand voltage test.

As seen from the above, in accordance with the present embodiment, a partial discharge signal can be detected by means of the acoustic emission sensor, by avoiding the influences of the power supply noise due to the impulse voltage generator, the mechanical oscillation component of the coil, and other external noises, even in an impulse withstand voltage test for a shell-type power transformer. Further, in accordance with the present embodiment, the margin before dielectric breakdown can be determined.

For correlation of a feature amount of the partial discharge signal obtained by the acoustic emission sensor with a feature amount of partial discharge, which is used for determining the margin before dielectric breakdown of the device, the following scheme may be used, for example.

The feature amount of the partial discharge signal measured by the acoustic emission sensor may be the maximum amplitude of the signal, the duration of the signal, or the frequency at which the partial discharge signal is generated.

The feature amount of partial discharge caused in the device may be the discharge length, discharge time or duration, or the amount of charge released due to partial discharge.

The correlation between these measurement signals and the feature amount of partial discharge can be acquired in advance to thereby determine the margin before dielectric breakdown, by estimating the feature amount of partial discharge from the feature amount of the partial discharge signal which is measured in a lighting impulse withstand voltage test for the device.

While applied-voltage capture unit 9, partial discharge determination unit 11, margin determination unit 12, mechanical oscillation removal unit 15, and feature amount identification unit 18 are implemented, in the present embodiment, by processor 31 executing a program stored in memory 32, they are not limited to this. For example, a person in charge of monitoring may manually operate an analysis tool or the like so that the functions of these units may be performed.

Second Embodiment

In an impulse withstand voltage test for a power device, discharge is initiated from high-voltage-side coil 4 to which an impulse voltage is applied and, when the discharge develops to reach ground coil 5, namely ground portion, high-voltage-side coil 4 is bridged (short-circuited), resulting in dielectric breakdown (complete electrical breakdown) of the power device. In a second embodiment, a margin is introduced into the impulse withstand voltage test, as an indicator representing to what extent the discharge should develop to reach ground coil 5, namely to cause dielectric breakdown (complete electrical breakdown).

Margin M can be expressed by the following expression where d1 is the distance from high-voltage-side coil 4 to ground coil 5, and d2 is the length of discharge which starts developing from high-voltage-side coil 4 toward ground coil 5.

$$M=1-d2/d1 \quad (3)$$

As seen from the above, in order to determine the margin before dielectric breakdown of the device, the scheme is most effective that uses, as an indicator, the length of discharge among the feature amounts of the partial discharge signal described above in connection with the first embodiment.

In order to acquire, before the impulse withstand voltage test, a correlation between the discharge length and a feature amount of the partial discharge signal acquired by the acoustic emission sensor, the following scheme may be used.

Figure 9:
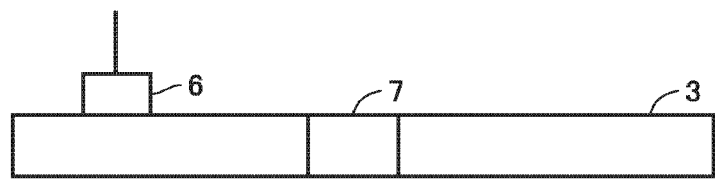
FIG. 9 is a diagram for illustrating a scheme for acquiring a correlation between a feature amount of a partial discharge signal and a discharge length.

FIG. 9 is a diagram for illustrating a scheme for acquiring a correlation between a feature amount of a partial discharge signal and a discharge length.

Generally the tank for shell-type power transformer 50 is made of metal and is not optically transparent. In addition, the tank is not equipped with a window or flange for checking the inside of the tank. Therefore, it is impossible to observe glow of discharge and the state of development of discharge in the tank during the impulse withstand voltage test. Moreover, the correlation between the discharge length and the feature amount of the partial discharge signal acquired by acoustic emission sensor 6 is not uniquely determined but depends on the structure and/or the size of shell-type power transformer 50.

Figure 10:
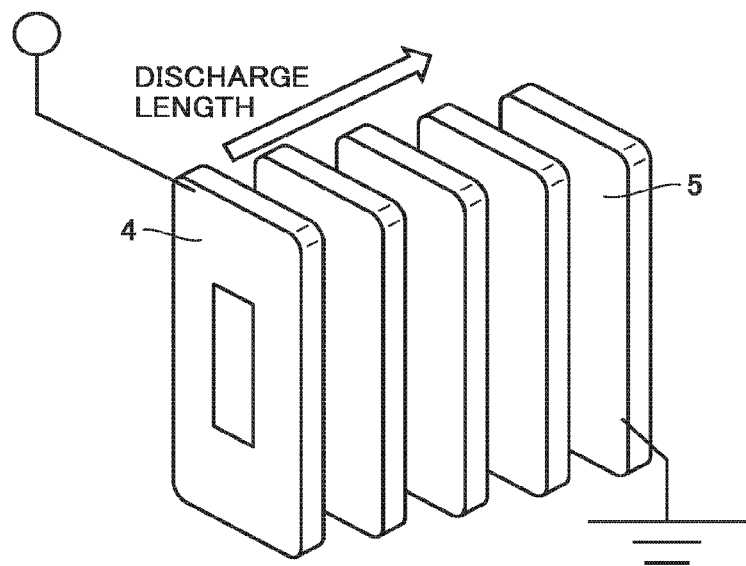
FIG. 10 is a diagram for illustrating the discharge length.

In view of this, in the present embodiment, a real-scale transformer model having the typical transformer structure is prepared and an observation window 7 is provided in tank 3 as shown in FIG. 9. At the same time the impulse withstand voltage test is conducted, acoustic emission sensor 6 is installed on the external surface of tank 3. To the real-scale transformer model, impulse voltage generator 14 and partial discharge determination apparatus 8 shown in FIG. 3 are connected to thereby extract a partial discharge signal and determine the feature amount of the partial discharge signal. Moreover, through observation window 7 of tank 3, the discharge length as shown in FIG. 10 is acquired.

As a method for optically observing the discharge length, photographing with a camera for example may be used. A still camera, a streak camera, or a framing camera can be used to reliably acquire the state of discharge and the discharge length, from the state of glow.

Detection of the partial discharge signal by acoustic emission sensor 6 and optical observation of development of the discharge can be simultaneously performed to thereby obtain a correlation value between a feature length of the partial discharge signal and the discharge length. This correlation value is stored in correlation value storage unit 19.

The inventors of the present application have experimentally found that there is a correlation between the discharge length and the amplitude of the first arrival wave of the partial discharge signal acquired by acoustic emission sensor 6.

Figure 11:
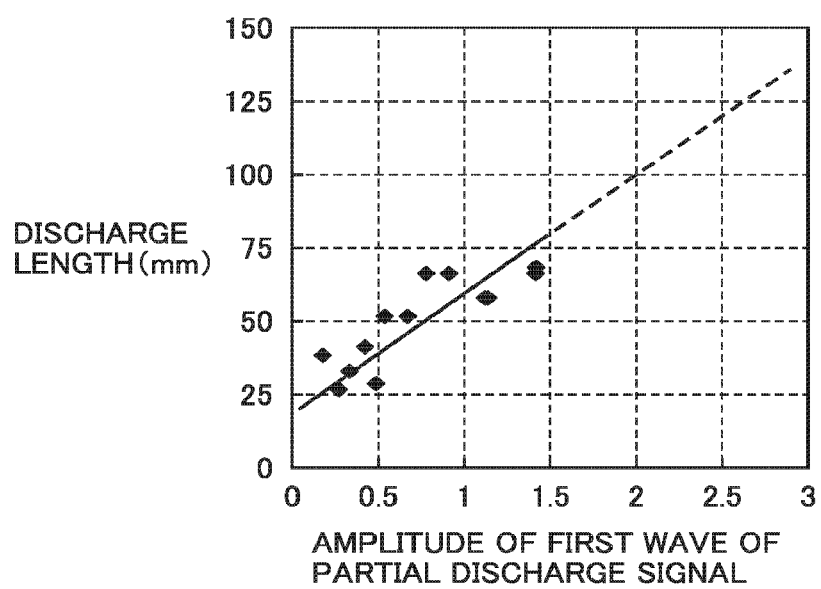
FIG. 11 is a diagram showing a relation between the discharge length and the amplitude of a first arrival wave of a partial discharge signal acquired by an acoustic emission sensor.

FIG. 11 is a diagram showing a relation between the discharge length and the amplitude of a first arrival wave of a partial discharge signal acquired by acoustic emission sensor 6. As shown in FIG. 11, there is a clear correlation between the amplitude of the first arrival wave and the discharge length.

In the second embodiment, as an indicator representing the correlation between the feature amount of the partial discharge signal and the discharge length, a correlation value between the amplitude of the first arrival wave of the partial discharge signal acquired by acoustic emission sensor 6 and the discharge length is used. In the present embodiment, feature amount identification unit 18 determines the amplitude of the first arrival wave of the partial discharge signal obtained by partial discharge determination unit 11, as a feature amount of the partial discharge signal.

Margin determination unit 12 for determining a margin before dielectric breakdown determines the discharge length in shell-type power transformer 50, using the correlation value stored in correlation value storage unit 19 that is obtained before the impulse withstand voltage test, from the feature amount of the partial discharge signal identified by feature amount identification unit 18. Further, margin determination unit 12 for determining a margin before dielectric breakdown determines margin M before breakdown in shell-type power transformer 50, based on the discharge length and the aforementioned expression (3).

Third Embodiment

In a third embodiment, as an indicator representing the correlation between the feature amount of the partial discharge signal and the discharge length, a correlation between the duration of the partial discharge signal obtained by the acoustic emission sensor and the discharge length is used.

Figure 12:
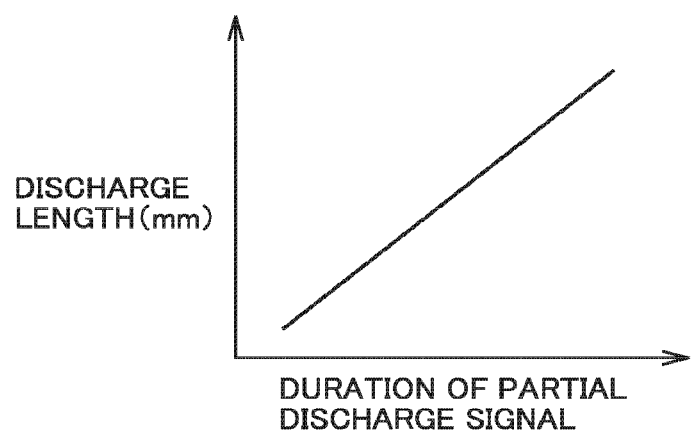
FIG. 12 is a diagram showing a relation between the discharge length and the duration of a partial discharge signal acquired by an acoustic emission sensor.

FIG. 12 is a diagram showing a relation between the discharge length and the duration of a partial discharge signal acquired by acoustic emission sensor 6.

The speed at which discharge develops in oil is known to be about 1000 meters per second. Namely, as the discharge length increases, the time required for discharge to develop also increases. The acoustic signal due to partial discharge is emitted all the time during development of discharge, and there is a correlation between the discharge length and the duration of the partial discharge signal as shown in FIG. 12.

The configuration of the partial discharge determination apparatus and the partial discharge determination method in the third embodiment are substantially identical to the configuration of the partial discharge determination apparatus and the partial discharge determination method in the first embodiment.

It should be noted that feature amount identification unit 18 in the third embodiment determines, as the feature amount of the partial discharge signal, the duration of the partial discharge signal acquired by partial discharge determination unit 11.

The start time of the partial discharge signal is defined as the time when the level of the waveform becomes equal to or more than a threshold value within a range of time from t1 to t2 of the acoustic signal waveform, with respect to the time when application of the impulse voltage is started. It should be noted that t1 and t2 have respective values identical to those described above in connection with the first embodiment.

The end time of the partial discharge signal is defined as the time when a state has continued for a certain time, and this state refers to a state where the level of the waveform is less than the threshold value within the range of time from t1 to t2 of the acoustic signal waveform, with respect to the time when application of the impulse voltage is started.

The start time of the partial discharge signal is subtracted from the end time of the partial discharge signal to determine the duration of the partial discharge signal.

The site of occurrence of partial discharge in the transformer structure is not necessarily uniquely determined, and the distance from the site of occurrence of discharge to the acoustic emission sensor may vary depending on each test. Since the acoustic signal decays as the signal is propagated through the oil or structure, the amount of decay may also vary depending on each test.

In the present embodiment, the duration of the partial discharge signal can be used as an indicator to estimate the discharge length, even when the partial discharge signal decays as it is propagated and accordingly the signal amplitude is decreased.

Fourth Embodiment

A partial discharge determination method in the present embodiment will be described in order. In the present embodiment, N acoustic emission sensors (first acoustic emission sensor to N-th acoustic emission sensor) are installed on tank 3 of shell-type power transformer 50. N is 4 or more. The identical or corresponding parts/characteristics to those of the first embodiment will not be described in detail.

When a plurality of acoustic emission sensors are installed on the external surface of tank 3 of shell-type power transformer 50 and a lighting impulse voltage is applied to shell-type power transformer 50, each sensor detects a mechanical oscillation component of the coil in shell-type power transformer 50. Generally, the acoustic emission sensors are different from one another in terms of the distance between the structure in shell-type power transformer 50 and the acoustic emission sensor and the angle of the acoustic emission sensor with respect to the structure in shell-type power transformer 50. Therefore, the sensors measure respective specific waveforms of the mechanical oscillation component that are different from one another. In this case as well, the period of the mechanical oscillation component detected by each sensor remains totally the same even when the value of the applied voltage is varied, but only the amplitude thereof is varied. Moreover, the amplitude of the mechanical oscillation component is proportional to the square of the charging current flowing through the coil of shell-type power transformer 50, which is also the same feature as the above-described one. It should be noted that the factor of proportionality varies depending on each acoustic emission sensor. With this characteristic taken into consideration, a low voltage which will not certainly cause partial discharge is applied and the resultant mechanical oscillation component is measured by each sensor in advance, and the waveform of the mechanical oscillation component is removed, by the method described above in connection with the first embodiment, from the waveform of the mechanical oscillation component which is detected by each sensor when a high-voltage impulse waveform having the peak value defined actually by the specification is applied. In this way, only the partial discharge signal can be extracted by each sensor. It should be noted that an acoustic signal component detected within a predetermined range of time, which is determined by respective installation locations of the high-voltage-charged unit in the transformer structure and each acoustic emission sensor, is identified as partial discharge, which is the same as the first embodiment.

Further, the difference in time of arrival between partial discharge signals detected by respective sensors can be acquired from the waveform record device to thereby locate the site of occurrence of partial discharge, based on the propagation velocity of the acoustic signal in the insulating oil. In order to uniquely locate the site of partial discharge in the tank having a three-dimensional structure, four acoustic emission sensors are required in terms of the principle. This step enables the distance from the site of occurrence of discharge to the acoustic emission sensor to be calculated. The acoustic signal decays as it is propagated through the oil. If the distance from the site of occurrence of discharge to the acoustic emission sensor can be calculated, the amount of decay due to propagation in the oil can be corrected and the discharge length can be accurately measured from the feature amount of the partial discharge signal.

One of the multiple acoustic emission sensors is designated as a representative acoustic emission sensor. For the representative acoustic emission sensor, the feature amount of the partial discharge signal is acquired and stored in correlation value storage unit 19 in advance. In this case, the margin is determined by the representative acoustic emission sensor. In the present embodiment, the first acoustic emission sensor is designated as the representative acoustic emission sensor.

Partial Discharge Determination Method

Figure 13:
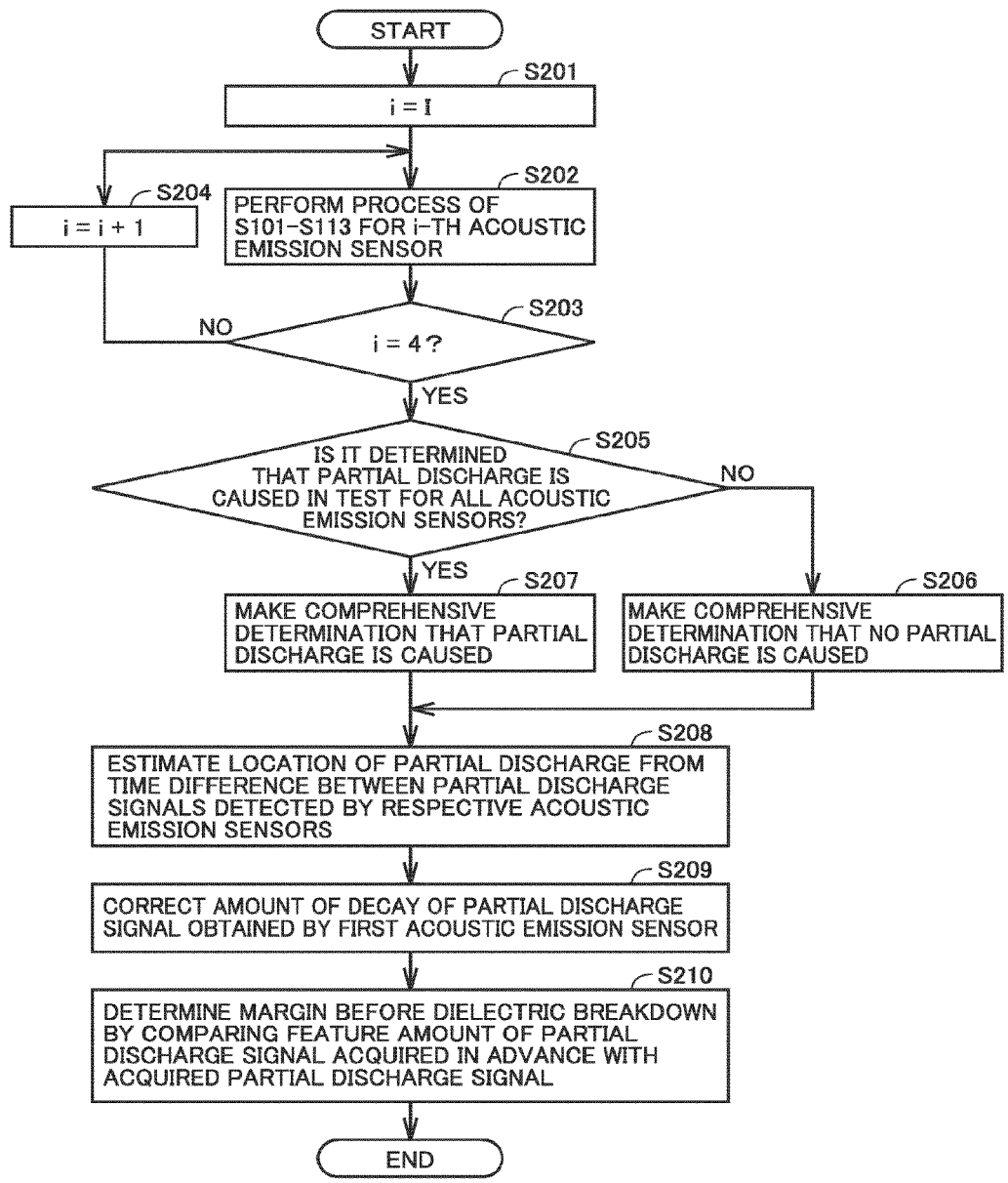
FIG. 13 is a flowchart showing a procedure of a partial discharge determination method in accordance with a fourth embodiment of the present invention.

FIG. 13 is a flowchart showing a procedure of the partial discharge determination method in accordance with the fourth embodiment of the present invention. The partial discharge determination method in accordance with the present embodiment will be described below in order of the steps.

First in step S201, variable i is set to 1.

In step S202, the process of steps S101 to S113 in FIG. 6 is performed for the i-th acoustic emission sensor.

In step S203, when variable i is 4, the process proceeds to step S205 and, when variable i is not 4, the process proceeds to step S204.

In step S204, the value of variable i is incremented and the process returns to step S202.

In step S205, when the results of determination for all the acoustic emission sensors are the determination that partial discharge is caused, the process proceeds to step S207. When the result of determination for at least one acoustic emission sensor is the determination that no partial discharge is caused, the process proceeds to step S206.

In step S206, partial discharge determination unit 11 makes a comprehensive determination that no partial discharge is caused.

In step S207, partial discharge determination unit 11 makes a comprehensive determination that partial discharge is caused.

In step S208, partial discharge determination unit 11 estimates the location of partial discharge, from the time difference between respective partial discharge signals obtained by the first to fourth acoustic emission sensors. Specifically, in the range of time from t1 to t2 of the acoustic signal waveforms obtained by the first to fourth acoustic emission sensors, with respect to the impulse voltage application start time, partial discharge start time s1, s2, s3, s4 is identified at which the level of the acoustic signal waveform becomes a threshold value or more. It should be noted that t1 and t2 are the values obtained by the method described above in connection with the first embodiment. Partial discharge determination unit 11 identifies the location where partial discharge has occurred, based on time s1, s2, s3, s4.

In step S209, partial discharge determination unit 11 corrects the amount of decay of the partial discharge signal obtained by the first acoustic emission sensor. Specifically, the larger the distance between the location where partial discharge has occurred and the first acoustic emission sensor, the greater the amount of correction added by partial discharge determination unit 11 to the partial discharge signal obtained by the first acoustic emission sensor.

In step S210, feature amount identification unit 18 identifies the feature amount of the partial discharge signal obtained by the first acoustic emission sensor. Margin determination unit 12 determines the margin before dielectric breakdown of shell-type power transformer 50, using the correlation value which is stored in correlation value storage unit 19, and which is obtained, before the impulse withstand voltage test, from the feature amount of the partial discharge signal identified by feature amount identification unit 18.

As seen from the above, in accordance with the present embodiment, the margin before dielectric breakdown can be estimated accurately, even when the site of occurrence of partial discharge is located far away from the position of the acoustic emission sensor.

A plurality of acoustic emission sensors may each acquire the feature amount of the partial discharge signal in advance, and the margin may be determined for the measurement signal of each acoustic emission sensor to thereby improve the accuracy of the determination of the margin before dielectric breakdown.

Moreover, five or more acoustic emission sensors may simultaneously take measurements to improve the accuracy with which the partial discharge site is located.

The method for manufacturing a power device may include the steps of: manufacturing a power device; determining a margin before dielectric breakdown of the manufactured power device, by performing the steps described above in connection with the embodiment; and testing the manufactured power device based on whether or not the margin is not less than a predetermined value.

REFERENCE SIGNS LIST

1 core; 2 coil portion; 3 tank; 4 high-voltage-side coil; 5 ground coil; 6 acoustic emission sensor; 7 observation window; 8 partial discharge determination apparatus; 9 applied-voltage capture unit; 10 waveform record device; 11 partial discharge determination unit; 12 margin determination unit; 13 low-pass filter; 14 impulse voltage generator; 15 mechanical oscillation removal unit; 18 feature amount identification unit; 19 correlation value storage unit; 20 output unit; 31 processor; 32 memory; 33 display; 40 partial discharge determination system; 50 shell-type power transformer

The invention claimed is:

1. A partial discharge determination method for a power device using an acoustic emission sensor, the method comprising:
applying an impulse voltage to a device under test;
acquiring an acoustic signal resulting from application of the impulse voltage, by the acoustic emission sensor installed on a wall surface of a casing which houses the device under test;
removing, through a low-pass filter, an electromagnetic noise superimposed on the acoustic signal detected by the acoustic emission sensor;
removing a mechanical oscillation component of the device under test, from the acoustic signal resulting from application of the impulse voltage which is a high voltage, based on the mechanical oscillation component acquired in advance and included in the acoustic signal resulting from application of the impulse voltage which is a low voltage causing no partial discharge;
determining whether partial discharge is caused in the device under test, based on the acoustic signal resulting from application of the impulse voltage which is the high voltage, the mechanical oscillation component being removed from the acoustic signal; and
determining, when the partial discharge is caused, a margin before dielectric breakdown of the device under test, by acquiring a feature amount of partial discharge, based on a correlation, acquired in advance, between a feature amount of a partial discharge signal obtained as an acoustic signal and the feature amount of partial discharge.

2. The partial discharge determination method according to claim 1, wherein
the removing a mechanical oscillation component includes:
calculating a mechanical oscillation component of the device under test included in the acoustic signal resulting from application of the impulse voltage which is the high voltage, by multiplying the mechanical oscillation component of the device under test included in the acoustic signal resulting from application of the impulse voltage which is the low voltage, by a square of a quotient, the quotient being determined by dividing a peak value of the impulse voltage which is the high voltage by a peak value of the impulse voltage which is the low voltage; and
removing the calculated mechanical oscillation component from the acoustic signal resulting from application of the impulse voltage which is the high voltage.

3. The partial discharge determination method according to claim 1, further comprising acquiring an application start time of the impulse voltage, wherein
the determining whether partial discharge is caused includes:
calculating a first time by dividing a shortest distance between a high-voltage-charged unit in the device under test and a location where the acoustic emission sensor is installed, by an acoustic signal propagation velocity in the device under test;
calculating a second time by dividing a longest distance between the high-voltage-charged unit in the device under test and a location where the acoustic emission sensor is installed, by the acoustic signal propagation velocity in the device under test; and
determining partial discharge is caused, when a component of the acoustic signal is detected between the first time and the second time, with respect to the application start time of the impulse voltage, and
determining no partial discharge is caused, when the component of the acoustic signal is not detected between the first time and the second time, with respect to the application start time of the impulse voltage.

4. The partial discharge determination method according to claim 1, wherein the determining a margin before dielectric breakdown uses a discharge length as the feature amount of partial discharge.

5. The partial discharge determination method according to claim 4, wherein the determining a margin before dielectric breakdown uses an amplitude of a first arrival wave of the partial discharge signal detected by the acoustic emission sensor, as the feature amount of the partial discharge signal obtained as an acoustic signal.

6. The partial discharge determination method according to claim 4, wherein the determining a margin before dielectric breakdown uses a duration of the partial discharge signal detected by the acoustic emission sensor, as the feature amount of the partial discharge signal obtained as an acoustic signal.

7. The partial discharge determination method according to claim 1, further comprising:
   locating a site of partial discharge, based on a difference in arrival time between respective partial discharge signals detected by four or more acoustic emission sensors; and
   correcting a decay amount of a peak value of each of the partial discharge signals, based on a distance from the located site of partial discharge to a corresponding one of the acoustic emission sensors.

8. A partial discharge determination apparatus for a power device, the partial discharge determination apparatus comprising:
   a low-pass filter configured to receive an acoustic signal and remove an electromagnetic noise superimposed on the acoustic signal, the acoustic signal being resulting from application of an impulse voltage to a device under test;
   a mechanical oscillation removal unit configured to remove a mechanical oscillation component of the device under test, from the acoustic signal resulting from application of the impulse voltage which is a high voltage, based on the mechanical oscillation component acquired in advance and included in the acoustic signal resulting from application of the impulse voltage which is a low voltage causing no partial discharge;
   a partial discharge determination unit configured to determine whether partial discharge is caused in the device under test, based on the acoustic signal resulting from application of the high voltage, the mechanical oscillation component being removed from the acoustic signal; and
   a margin determination unit configured to determine, when the partial discharge is caused, a margin before dielectric breakdown of the device under test, by determining a feature amount of partial discharge based on a correlation, acquired in advance, between a feature amount of a partial discharge signal obtained as an acoustic signal and the feature amount of partial discharge.

9. A partial discharge determination system for a power device, the partial discharge determination system comprising:
   an impulse voltage generator configured to apply an impulse voltage to a device under test;
   an acoustic emission sensor installed on a wall surface of a casing which houses the device under test;
   a low-pass filter configured to receive an acoustic signal and remove an electromagnetic noise superimposed on the acoustic signal, the acoustic signal being resulting from application of the impulse voltage, the acoustic signal being acquired by the acoustic emission sensor;
   a mechanical oscillation removal unit configured to remove a mechanical oscillation component of the device under test, from the acoustic signal resulting from application of the impulse voltage which is a high voltage, based on the mechanical oscillation component acquired in advance and included in the acoustic signal resulting from application of the impulse voltage which is a low voltage causing no partial discharge;
   a partial discharge determination unit configured to determine whether partial discharge is caused in the device under test, based on the acoustic signal resulting from application of the high voltage, the mechanical oscillation component being removed from the acoustic signal; and
   a margin determination unit configured to determine, when the partial discharge is caused, a margin before dielectric breakdown of the device under test, by determining a feature amount of partial discharge based on a correlation, acquired in advance, between a feature amount of a partial discharge signal obtained as an acoustic signal and the feature amount of partial discharge.

* * * * *